(12) United States Patent
Kokas et al.

(10) Patent No.: US 9,198,328 B1
(45) Date of Patent: Nov. 24, 2015

(54) THERMAL SEPARATION OF ELECTRONIC CONTROL CHASSIS HEATSINK FINS

(75) Inventors: Jay W. Kokas, East Granby, CT (US); Michael Maynard, Springfield, MA (US); Kerry R. Querns, Durham, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 842 days.

(21) Appl. No.: 13/456,757

(22) Filed: Apr. 26, 2012

(51) Int. Cl.
*H05K 7/20* (2006.01)
*H05K 7/14* (2006.01)
*G06F 1/20* (2006.01)

(52) U.S. Cl.
CPC .............. *H05K 7/20418* (2013.01); *H05K 7/14* (2013.01)

(58) Field of Classification Search
CPC .............. H05K 7/20; H05K 7/04; H05K 5/00; H05K 7/20518; G06F 1/20
USPC ............. 361/679.01, 679.46, 679.54, 679.55, 361/690–694, 700–715, 831; 165/80.2, 165/80.3, 104.33, 121, 122, 185; 257/707, 257/712, 713, 719; 174/15.1, 50.52, 520; 312/223.2, 236
See application file for complete search history.

(56) References Cited

U.S. PATENT DOCUMENTS

| | | | |
|---|---|---|---|
| 4,933,808 A * | 6/1990 | Horton et al. ................. | 361/715 |
| 5,305,186 A * | 4/1994 | Appelt et al. ................. | 361/704 |
| 5,896,272 A * | 4/1999 | Hendrix et al. ............... | 361/704 |
| 5,937,937 A | 8/1999 | Sehmbey et al. | |
| 5,977,630 A * | 11/1999 | Woodworth et al. ......... | 257/712 |
| 6,252,774 B1 * | 6/2001 | Rife .............................. | 361/704 |
| 6,625,025 B1 * | 9/2003 | Duxbury et al. .............. | 361/704 |
| 6,661,661 B2 | 12/2003 | Gaynes et al. | |
| 6,836,409 B1 * | 12/2004 | Duxbury et al. .............. | 361/704 |
| 6,999,312 B1 | 2/2006 | Garnett et al. | |
| 7,071,550 B2 * | 7/2006 | Sato .............................. | 257/706 |
| 7,254,034 B2 * | 8/2007 | Bolle ................... | H05K 9/0033 165/185 |
| 7,460,368 B2 * | 12/2008 | Su et al. ........................ | 361/690 |
| 7,492,598 B2 * | 2/2009 | Narasimhan et al. ......... | 361/719 |
| 7,755,895 B2 * | 7/2010 | Ikeda ............................ | 361/704 |
| 8,497,813 B2 * | 7/2013 | Rodger .................... | H01Q 1/02 343/702 |
| 8,537,555 B2 * | 9/2013 | Huang .................... | H04B 1/036 165/104.33 |
| 8,913,389 B2 * | 12/2014 | Fukui et al. .................. | 361/710 |
| 9,000,582 B2 * | 4/2015 | Hiramitsu ............... | H01L 21/52 257/140 |
| 2005/0237620 A1 * | 10/2005 | Hsu ........................ | G02B 7/181 369/618 |
| 2006/0126309 A1 * | 6/2006 | Bolle ................... | H05K 9/0033 361/719 |
| 2007/0258209 A1 * | 11/2007 | Su ....................... | H05K 7/20963 361/690 |
| 2009/0129076 A1 * | 5/2009 | Kraus .......................... | 362/234 |

* cited by examiner

*Primary Examiner* — Michail V Datskovskiy
(74) *Attorney, Agent, or Firm* — Kinney & Lange, P.A.

(57) ABSTRACT

An electronics chassis for containing and supporting electronic components having different operating temperatures includes a plurality of thermally conductive walls forming an enclosure. There is a first heat dissipator in at least one of the walls having an external heat dissipator and a second heat dissipator in at least one of the walls having an external heat dissipator. There is a thermal isolator positioned in at least one of the walls to provide thermal isolation between the heat dissipators, and the thermal isolator includes a thermally insulating material.

20 Claims, 4 Drawing Sheets

US 9,198,328 B1

THERMAL SEPARATION OF ELECTRONIC CONTROL CHASSIS HEATSINK FINS

STATEMENT OF GOVERNMENT INTEREST

This invention was made with government support under FA8650-06-D-2621 awarded by the United States Air Force. The government has certain rights in the invention.

BACKGROUND

This invention relates to chassis for electronic components, and, more specifically, to chassis for electronic components that include heatsinks.

When electronic components such as motor controllers are operated, heat is generated. Because these components are designed to operate within certain temperature ranges, this heat must be dissipated from the system in order to promote efficient operation and avoid overheating. Therefore, heatsinks have been used to control the temperature of electronics. Heatsinks are generally comprised of thermally conductive material and are thermally connected to the electronic components. Heatsinks also include features that increase surface area, such as fins, which provide greater heat loss, through convection, to the ambient environment. Thereby, heat can be transferred from the electronic components and dissipated to the atmosphere.

It can be beneficial to attach more than one electronic component to a heatsink. Because a heatsink is a good thermal conductor, during operation of the electronic components the bulk of the heatsink, including the portion to which the components are mounted, will be at approximately the same temperature. This can be problematic if one of the electronic components requires a lower operating temperature than the other and/or if this component emits less heat than the other while, at the same time, the other component is dissipating much more heat and driving up the temperature of the heatsink. In this case the ambient temperature of the environment the components are located in can also cause overheating of the lower operating temperature components.

SUMMARY

According to one embodiment of the present invention, an electronics chassis for containing and supporting electronic components having different operating temperatures includes a plurality of thermally conductive walls forming an enclosure. There is a first heat generator in at least one of the walls having an external heat dissipator and a second heat generator in at least one of the walls having an external heat dissipator. There is a thermal isolator positioned in at least one of the walls to provide thermal isolation between the heat dissipators, and the thermal isolator includes a thermally insulating material.

In another embodiment, an electronic system includes an electronics chassis and two electronic components. The electronics chassis includes two electronic components generating heat that are separated by a thermal isolator, wherein one electronic component is mounted to one heat dissipator and the other electronic component is mounted to the other heat dissipator.

DETAILED DESCRIPTION

Figure 1:
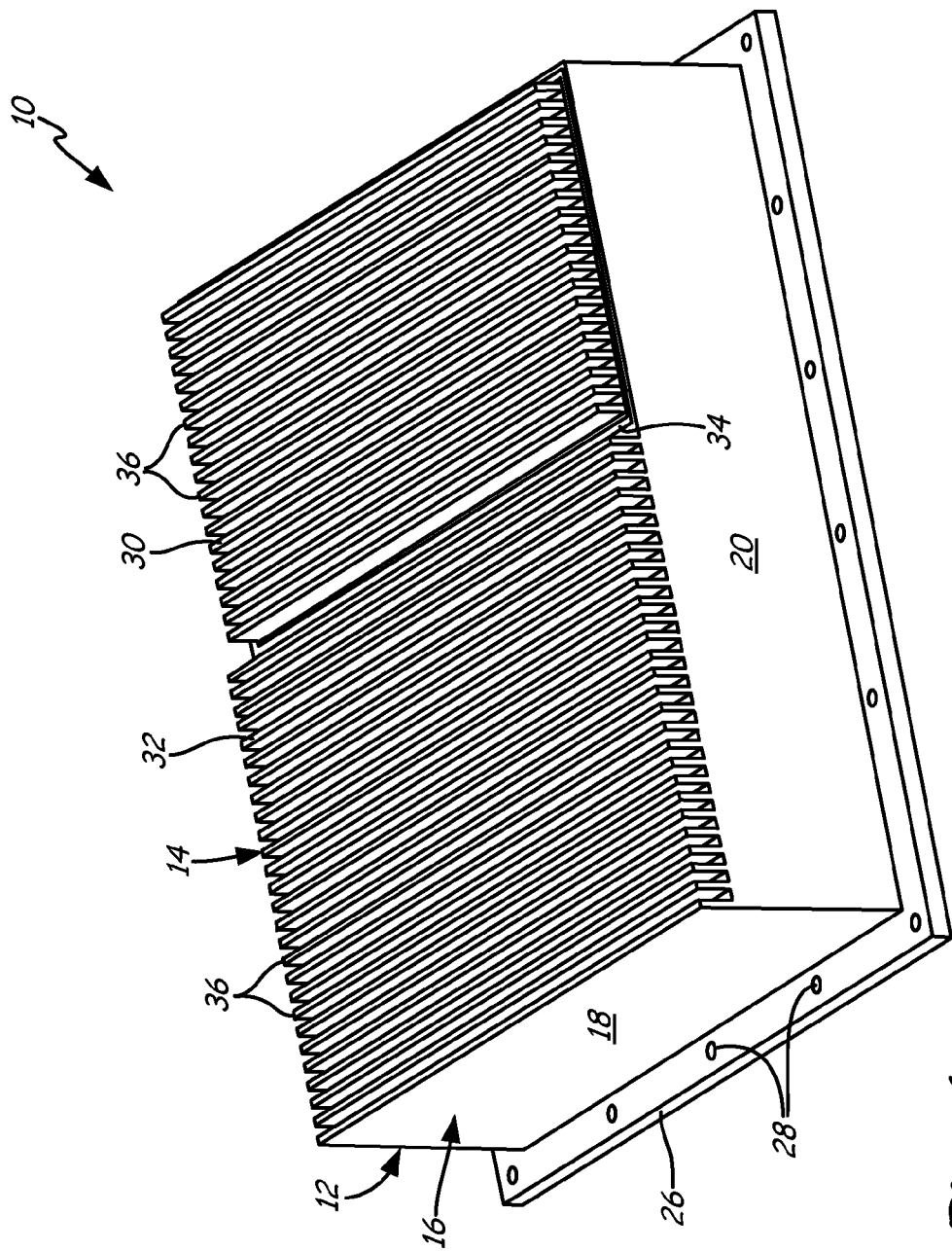
FIG. 1 is a perspective view of an electronic system including an electronics chassis.
Figure 2:
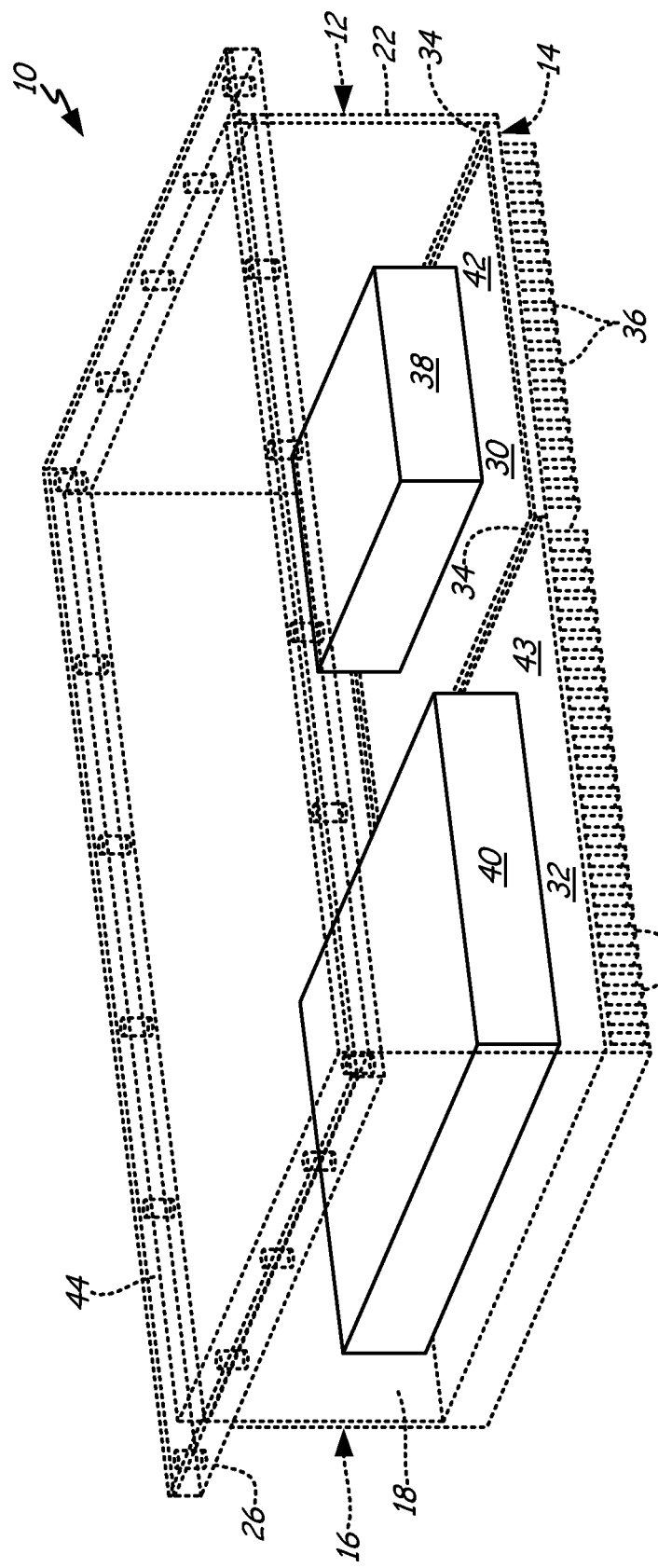
FIG. 2 is a perspective view of the electronic system with an electronics chassis in shadow.
Figure 3:
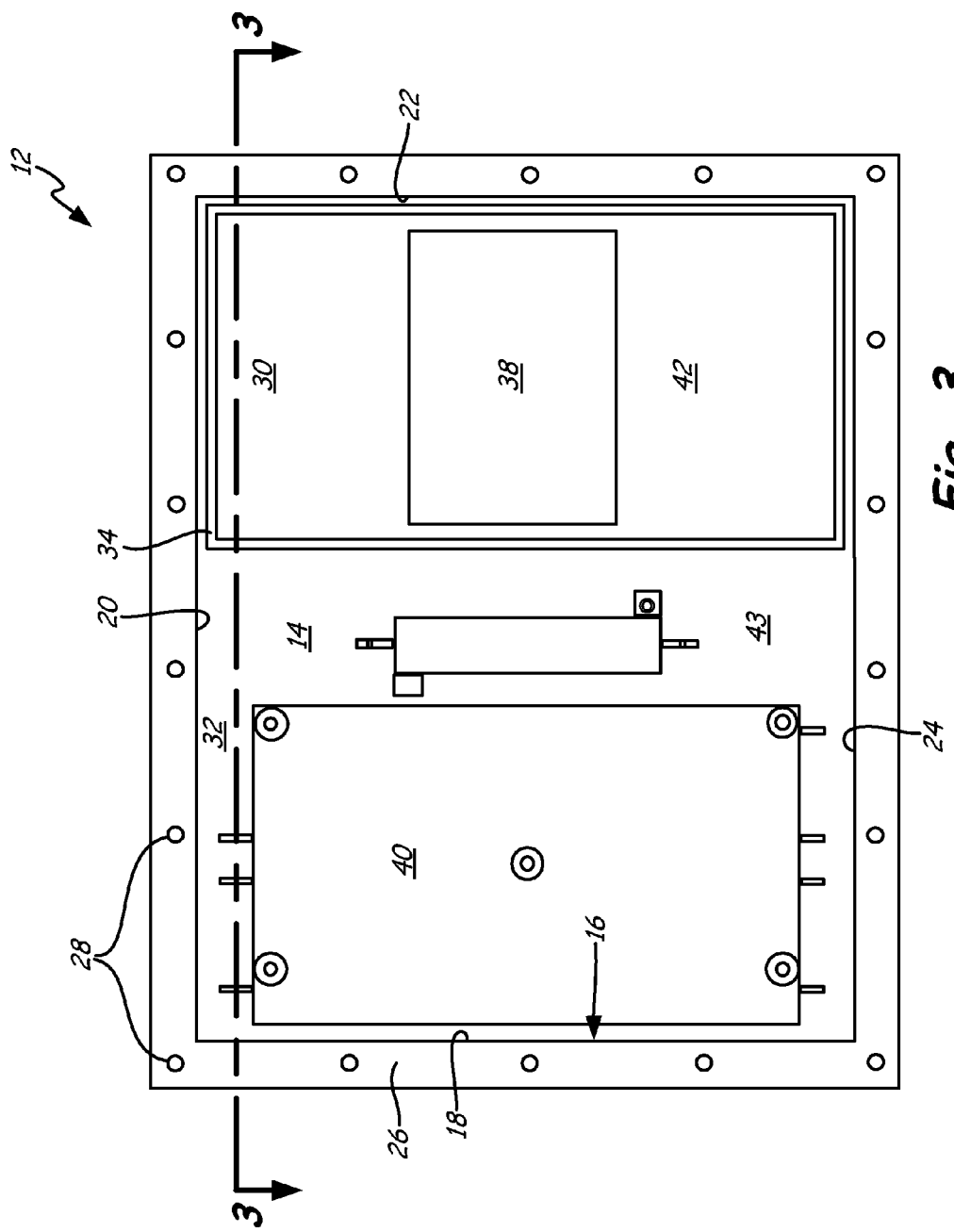
FIG. 3 is a bottom view of the electronics chassis including two electronic components.

In FIG. 1, a perspective view of electronic system 10 is shown, including electronics chassis 12. In FIG. 2, a perspective view of electronic system 10 with electronics chassis 12 in shadow. In FIG. 3, a bottom view of electronics chassis 12 is shown, including first electronic component 38 and second electronic component 40. FIGS. 1-3 will now be discussed simultaneously.

Electronic system 10 includes electronics chassis 12, first electronic component 38, second electronic component 40, and cover plate 44. In general, electronics chassis 12 is a unitary structure with top side 14, shroud 16, and flange 26, and electronics chassis 12 is comprised of a thermally conductive material, such as aluminum. Top side 14 includes an aperture, into which first heat dissipator 30 is affixed. More specifically, first heat dissipator 30 is bonded to top side 14 by thermal isolator 34. This is possible because thermal isolator 34 comprises a material with structural and adhesive properties, such as a non-thermally conductive elastomer (for example, a polyamide material).

In addition, top side 14 includes second heat dissipator 32. Therefore, thermal isolator 34 is positioned between first heat dissipator 30 and second heat dissipator 32. Heat dissipators 30, 32 have increased surface area on their respective top sides (opposite of mounting surface 42,43) because heat dissipators 30, 32 include fins 36. Mounted to mounting surface 42 of top side 14 inside shroud 16 is first electronic component 38. Mounted to mounting surface 43 of top side 14 inside shroud 16 is second electronic component 40. Thereby, electronic components 38, 40 are thermally connected to heat dissipators 30, 32, respectively. One skilled in the art can appreciate that although directional terms such as "top side", "bottom side", "underneath", and "downward" are used to describe this invention, such terms are merely relational descriptors of the illustrated embodiments shown herein.

In the illustrated embodiment, shroud 16 extends perpendicularly downward from top side 14, beyond electronic components 38, 40. Shroud 16 comprises first side 18, second side 20 which is adjacent to first side 18, third side 22 which is adjacent to second side 20, and fourth side 24, which is adjacent to third side 22 and first side 18. Attached around shroud 16 is flange 26 which includes a plurality of mounting holes 28. Cover plate 44 is attached to flange 26 through mounting holes 28 to create a bottom side of electronic system 10.

During operation of electronic component 38, heat is generated and is transferred to heat dissipator 30 by conduction. During operation of electronic component 40, heat is generated and is transferred to heat dissipator 32 by conduction. This heat is then dissipated to the atmosphere by convection. In the illustrated embodiment, first electronic component 38 is a high heat generating, high operating temperature rated electronic component whereas second electronic component 40 is a lower heat generating, lower operating temperature rated electronic component. Therefore during operation of first electronic component 38 emits more heat than second electronic component 40. In practice, first heat dissipator 30 is at approximately 240° C. and second heat dissipator 32 is at approximately 180° C. during operation. This also means that first heat dissipator 30 dissipates more heat than second heat dissipator 32.

The components and configuration of electronic system 10 as shown in FIGS. 1-3 allow for electronics chassis 12 to be made from two pieces. In addition, heat can be eliminated from electronic components 38, 40 and transferred to the atmosphere. In addition, FIGS. 1 and 2 show one embodiment of the present invention, to which there are alternatives. For example, there can be more than one first electronic component 38 mounted to first heat dissipator 30 and there can be more than one second electronic component 40 mounted to second heat dissipator 32. For another example, the operating temperatures of first heat dissipator 30 and second heat dissipator 32 can vary from the embodiment listed above, in part due to the components used or the application of electronic system 10.

Figure 4:
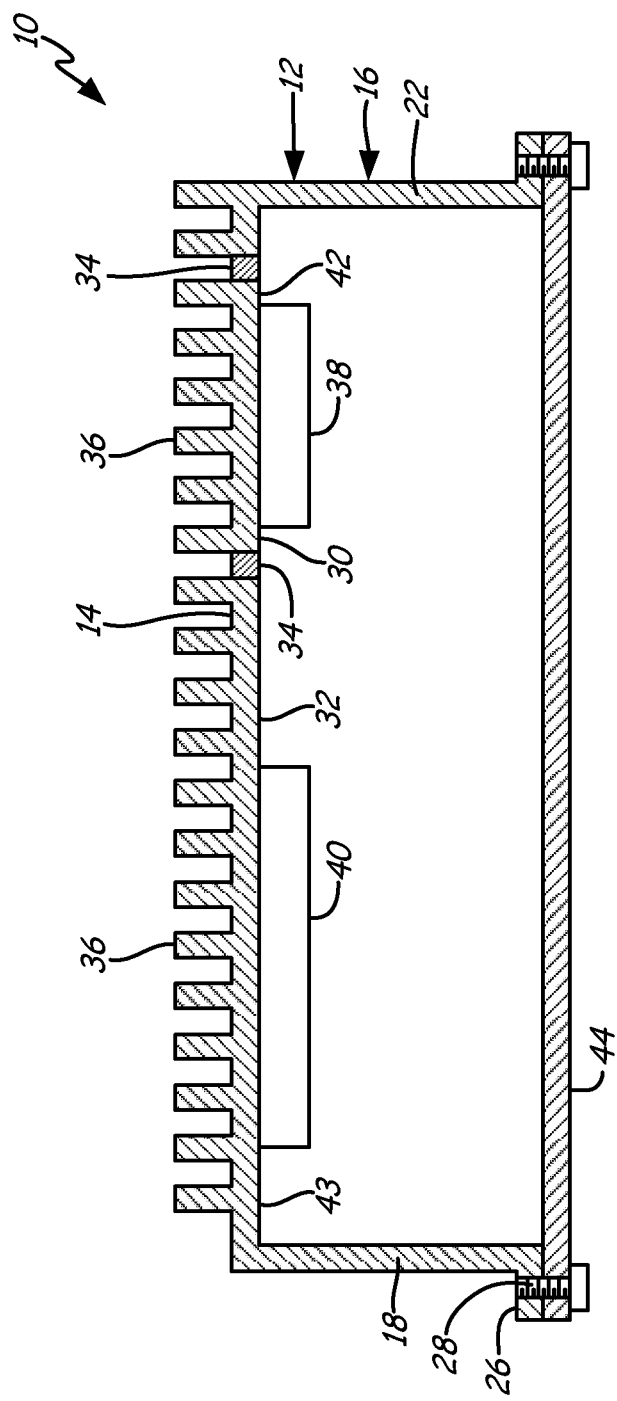
FIG. 4 is a cross-section view of the electronic system including a thermal isolator along line 3-3 in FIG. 3.

In FIG. 4, a cross-section view of electronic system 10 is shown along line 3-3 in FIG. 3, including thermal isolator 34. Shown in FIG. 4 is the same embodiment as shown in FIGS. 1-3 with additional features being visible.

As stated previously, during operation of electronic components 38, 40, first heat dissipator 30 is at a greater temperature than second heat dissipator 32. This is possible because thermal isolator 34 substantially prevents heat transfer between first heat dissipator 30 and second heat dissipator 32. This is possible because thermal isolator 34 comprises a material with low thermal conductivity such as a non-thermally conductive elastomer (for example, a polyamide material).

In other words, thermal isolator 34 acts as a thermal isolator to isolate the higher operating temperature component(s) 38 from the lower operating temperature component(s) 40. In the illustrated embodiment, thermal isolator 34 forms a thermal isolation ring around higher operating temperature component 38.

The components and configuration of electronic system 10 as shown in FIG. 3 allow for electronic components 38, 40 to be protected by electronics chassis 12. Furthermore, heat transfer can occur from first electronic component 38, through first heat dissipator 30, and to the atmosphere. But heat transfer from first heat dissipator 30 to second heat dissipator 32 is impeded, which prevents first electronic component 38 from heating up (and possibly overheating) second electronic component 40.

It should be recognized that the present invention provides numerous benefits and advantages. For example, multiple electronic components with different operating temperatures can be mounted to the same chassis substantially without having heat transfer occur between the electronic components.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. An electronics chassis for containing and supporting electronic components having different operating temperatures, the electronics chassis comprising:
    a plurality of thermally conductive walls forming an enclosure;
    a first heat dissipator in at least one of the walls having an external heat dissipation surface;
    a second heat dissipator in at least one of the walls having an external heat dissipation surface; and
    a thermal isolator positioned in at least one of the walls and substantially surrounding the first heat dissipator to provide thermal isolation between the first and second heat dissipators, the thermal isolator comprising a thermally insulating material.

2. The electronics chassis of claim 1, wherein the external heat dissipation surface of the first heat dissipator includes fins to increase surface area for heat dissipation.

3. The electronics chassis of claim 1, wherein the external heat dissipation surface of the second heat dissipator includes fins to increase surface area for heat dissipation.

4. The electronics chassis of claim 1, wherein the thermally insulating material comprises a non-thermally conductive polyamide elastomer.

5. The electronics chassis of claim 1, wherein the plurality of walls includes a top and four sides.

6. The electronics chassis of claim 1, and further comprising:
    a mounting flange attached to at least three of the sides; and
    a cover plate attached to the flange to form a bottom of the electronics chassis.

7. The electronics chassis of claim 1, wherein the first and second heat dissipators are located on the top.

8. An electronic system comprising:
    an electronics chassis that includes a first heat dissipator and a second heat dissipator that are separated by a thermal isolator wherein the thermal isolator substantially surrounds the first heat dissipator;
    a first electronic component mounted to the first heat dissipator within the chassis; and
    a second electronic component mounted to the second heat dissipator within the chassis.

9. The electronic system of claim 8, wherein the chassis includes a top and side walls that enclose the first and second electronic components.

10. The electronic system of claim 8, wherein the first and second heat dissipators are located in the top of the chassis and each include an inner surface to which the first and second electronic components are mounted, respectively.

11. The electronic system of claim 8, wherein the first heat dissipator includes fins on an external surface for heat dissipation.

12. The electronic system of claim 8, wherein the second heat dissipator includes fins on an external surface for heat dissipation.

13. The electronic system of claim 8, wherein the thermal isolator comprises a non-thermally conductive elastomer.

14. The electronic system of claim 8, and further comprising:
    a mounting flange attached to the side walls; and
    a cover plate attached to the flange to form a bottom side of the electronics chassis.

15. The electronic system of claim 8, wherein during operation of the first and second electronic components, the first electronic component emits more heat than the second electronic component.

16. The electronic system of claim 8, wherein during operation of the first and second electronic components, the first heat dissipator dissipates more heat that the second heat dissipator.

17. The electronic system of claim 8, wherein during operation of the first and second electronic components, there is a temperature difference between the first heat dissipator and the second heat dissipator.

18. An electronic system comprising:
- an electronics chassis that includes a first heat dissipator and a second heat dissipator that are separated by a thermal isolator wherein the thermal isolator forms a thermal isolation ring around the first heat dissipator;
- a first electronic component mounted to the first heat dissipator within the chassis; and
- a second electronic component mounted to the second heat dissipator within the chassis.

19. The electronic system of claim 18, and further comprising:
- a mounting flange attached to the side walls; and
- a cover plate attached to the flange to form a bottom side of the electronics chassis.

20. The electronic system of claim 18, wherein during operation of the first and second electronic components, there is a temperature difference between the first heat dissipator and the second heat dissipator.

\* \* \* \* \*